United States Patent
Xu

(10) Patent No.: US 10,135,417 B2
(45) Date of Patent: Nov. 20, 2018

(54) COUPLING CIRCUITS WITH CAPACITORS

(71) Applicant: FOXCONN INTERCONNECT TECHNOLOGY LIMITED, Grand Cayman (KY)

(72) Inventor: Yong-Chun Xu, Kunshan (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/396,801

(22) Filed: Jan. 2, 2017

(65) Prior Publication Data
US 2017/0194931 A1    Jul. 6, 2017

(30) Foreign Application Priority Data
Dec. 31, 2015    (CN) .......................... 2015 1 1013367

(51) Int. Cl.
| H03H 7/06 | (2006.01) |
| H03H 7/42 | (2006.01) |
| H03H 7/01 | (2006.01) |
| H03H 7/38 | (2006.01) |
| H03H 7/48 | (2006.01) |
| H03H 1/00 | (2006.01) |

(52) U.S. Cl.
CPC .......... H03H 7/427 (2013.01); H03H 7/0138 (2013.01); H03H 7/06 (2013.01); H03H 7/1708 (2013.01); H03H 7/1766 (2013.01); H03H 7/38 (2013.01); H03H 7/482 (2013.01); H03H 1/0007 (2013.01)

(58) Field of Classification Search
CPC ......... H03H 1/0007; H03H 7/427; H03H 7/06
USPC .......................................... 333/185; 439/676
See application file for complete search history.

(56) References Cited

U.S. PATENT DOCUMENTS

| 2012/0021640 | A1* | 1/2012 | Masuda .............. H04L 25/0272 439/502 |
| 2014/0268933 | A1* | 9/2014 | Zhou ....................... H02M 1/12 363/44 |
| 2015/0318834 | A1* | 11/2015 | Wu ....................... H03H 1/0007 333/12 |
| 2017/0294835 | A1* | 10/2017 | Andersson ............ H02M 1/126 |

FOREIGN PATENT DOCUMENTS

| CN | 203368413 | 12/2013 |
| CN | 204733134 | 10/2015 |

* cited by examiner

*Primary Examiner* — Rakesh Patel
(74) *Attorney, Agent, or Firm* — Wei Te Chung; Ming Chieh Chang

(57) ABSTRACT

The network filtering circuit includes a cable side for connection with a network cable, a physical side for connection with a mother board, and a plurality of transmission channels connected between the cable side and the physical side. Each of the transmission channels includes a first transmission line and a second transmission line with a CMC linked therebetween. Two filtering (Y type) capacitors are further linked between the first transmission line and the second transmission line with a middle line connected between the two filtering capacitors and having an extension line wherein in such an extension line there are a resistor and an optional adjusting capacitor to a ground node at the end in series connection.

15 Claims, 1 Drawing Sheet

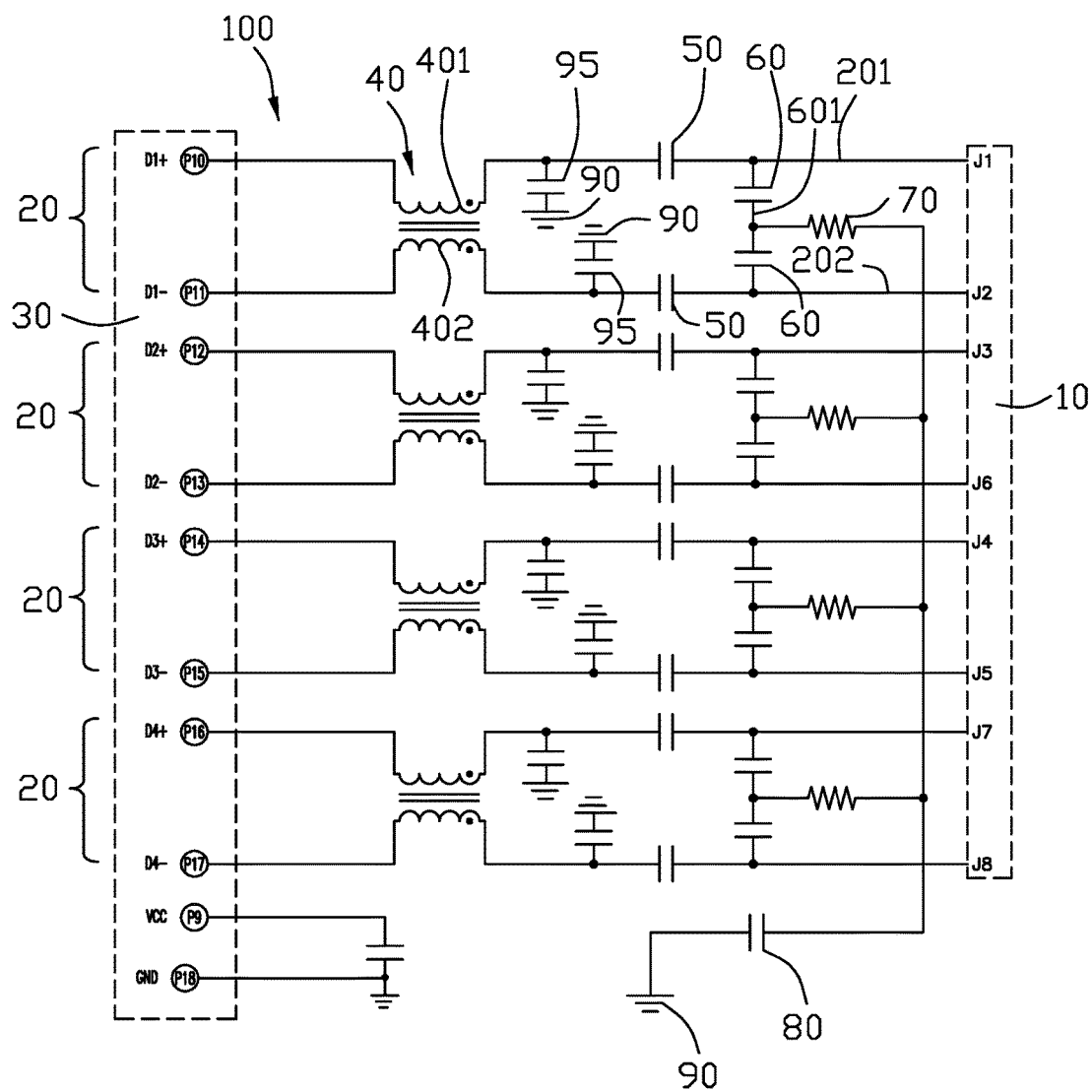

COUPLING CIRCUITS WITH CAPACITORS

BACKGROUND OF THE INVENTION

1. Field of the Invention

The present invention relates to a network filtering circuit, and more particularly to a preferable Electromagnetic Compatibility (EMC) and impedance matching circuit network.

2. Description of Related Arts

Chinese Patent No. CN204733134U issued on Dec. 25, 2013, discloses a network filtering circuit including a cable side, a physical side, and a plurality of differential pair transmission channels connected therebetween. Each of the transmission channels includes a CMC (Common Mode Choke) and two Y type capacitors. Each differential pair transmission channel includes a first transmission line and a second transmission line with the aforementioned two Y type capacitors respectively connected within the first transmission line and the second transmission line in series connection. The CMC includes a first coil and a second coil coupled with each other wherein the CMC is closer to the physical side while the two Y type capacitors are closer to the cable side and directly directed to the ground node. The Electro Magnetic Interference (EMI) is derived from the ground line which performs reference potential, If the ground line is improperly designed, the ground potential will be unstable that have the whole network circuits malfunction. The ground line is used for stabilizing the ground potential, thus eliminating the interference. The prior art shows the Y type capacitor is directly linked to the ground node, thus having the first transmission line and the second transmission line tend to receive the EMI from the ground node and affecting the signal transmission.

SUMMARY OF THE INVENTION

Accordingly, an object of the present invention is to provide network filtering circuit with preferable Electro Magnetic compatibility and impedance matching. The invention includes a cable side for connection with a network cable, a physical side for connection with a mother board, and a plurality of differential pair transmission channels connected between the cable side and the physical side. Each of the transmission channels includes a first transmission line, the second transmission line, two first capacitors linked between the first transmission line and the second transmission line in series connection with a middle line linked to a position of a connection line between these two first capacitors wherein a resistor has one end linked to the middle line and the other end eventually linked to a ground node.

Accordingly, another object of the present invention is to provide network filtering circuit with preferable Electro Magnetic compatibility and impedance matching. The invention includes a cable side for connection with a network cable, a physical side for connection with a mother board, and a plurality of differential pair transmission channels connected between the cable side and the physical side. Each of the transmission channels includes a first transmission line and a second transmission line with a CMC and two coupling capacitors connected thereto in series connection wherein the CMC includes a first coil and a second coil respectively connected to the first transmission line and the second transmission line, the CMC is closer to the physical side while and the two coupling capacitors are closer to the cable side. The network circuit further includes two filtering (Y type) capacitors linked between the first transmission line and the second transmission line, a middle line connected between the two filtering capacitors and having an extension line wherein in such an extension line there are a resistor and an optional adjusting capacitor to a ground node at the end in series connection.

Compared with the prior arts, the invention provides the middle line with an additional resistor before reaching the ground node so as to achieved an efficient grounding effect and the better EMC and corresponding impedance matching.

Other objects, advantages and novel features of the invention will become more apparent from the following detailed description when taken in conjunction with the accompanying drawings.

BRIEF DESCRIPTION OF THE DRAWING

FIG. 1 is a network filtering circuit according to the invention.

DETAILED DESCRIPTION OF THE PREFERRED EMBODIMENT

Reference will now be made in detail to some preferred embodiments of the present invention.

Referring to FIG. 1, a network filtering circuit 100 according to the invention. The network filtering circuit 100 includes a cable side 10 for connection with a network cable, a physical side 30 for connection with a mother board, and a plurality of transmission channels 20 connected between the cable side 10 and the physical side 30.

Each of the transmission channels 60 includes a first (differential) transmission line 201, the second (differential) transmission line 202, and a CMC 40 and two filtering/first capacitors 60 linked, in series connection, between the first transmission line 201 and the second transmission line 202. The CMC 40 includes a first coil 401 and a second coil 402 coupled with each other and respectively connected with the corresponding first transmission line 201 and the second transmission line 202. Two coupling/second capacitors 50 are respectively connected with the corresponding first transmission line 201 and the second transmission line 202 and linked to the corresponding first coil 401 and second coil 402 in series connection. Notably, the CMC is closer to the physical side while the second capacitors 50 are closer to the cable side 10.

A middle line 601 is between the two first capacitors 60 with an extension line (not labeled), and in such an extension line there are a resistor 70 and an adjusting/third capacitor 80 and a ground node 90 at the end in series connection sequentially wherein the resistor 70 is connected between the middle line 601 and the third capacitor 80.

Notably, the second capacitors 50 are located between the CMC and the first capacitors 40. Each of the first transmission line 201 and the second transmission line 202 further includes a fourth capacitor 95 located between the CMC and the corresponding second capacitor 50, and is further directly connected to another ground node 90. Under this arrangement, the first capacitor 60 and the fourth capacitor 95 are respectively linked to two opposite ends of the corresponding second capacitor 50. In this design, the resistor 70 is of 75Ω, the third capacitor 80 is of 1000 pF.

Compared with the prior arts, the invention provides the middle line 601 with an additional resistor 70 and an optional third capacitor 80 before reaching the ground node 90 so as to achieve an efficient grounding effect and the better EMC and corresponding impedance matching.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A network filtering circuit comprising:
a cable side for connection to a network cable;
a physical side for connection to a mother board; and
a plurality of transmission channels connected between the cable side and the physical side, each transmission channel comprising:
a first transmission line and a second transmission line,
a common mode choke having a first coil and a second coil respectively connected to the first transmission line and second transmission line,
two first capacitors connected in series between the first transmission line and the second transmission line, wherein the common mode choke is closer to the physical side while the two first capacitors are closer to the cable side,
a middle line connected between the two first capacitors with an extension line having a distal end connected to a ground node, and
two second capacitors connected with the first transmission line and the second transmission line; wherein
a resistor is positioned in the extension line of each transmission channel, and a third capacitor is connected between the ground node and the resistor in the extension line of each transmission channel.

2. The network filtering circuit as claimed in claim 1, wherein said two second capacitors are located between the common mode choke and the two first capacitors.

3. The network filtering circuit as claimed in claim 2, wherein all of the plurality of transmission channels share the same third capacitor and the same ground node.

4. The network filtering circuit as claimed in claim 1, further including two fourth capacitors connected to the first transmission line and the second transmission line in each transmission channel, wherein each fourth capacitor is further connected to another ground node.

5. The network filtering circuit as claimed in claim 4, wherein in each transmission channel, said two fourth capacitors are located between the two second capacitors and the common mode choke.

6. The network filtering circuit as claimed in claim 4, wherein in each transmission channel, the two fourth capacitors share the same another ground node.

7. The network filtering circuit as claimed in claim 4, wherein in each of the first transmission line and the second transmission line of each transmission channel, the fourth capacitor and the corresponding first capacitor are connected to two opposite ends of the second capacitor.

8. The network filtering circuit as claimed in claim 1, wherein all of the plurality of transmission channels share the same third capacitor and the same ground node.

9. A network filtering circuit comprising:
a cable side for connection to a network cable;
a physical side for connection to a circuit board; and
a plurality of transmission channels connected between the cable side and the physical side, each transmission channel comprising:
a first transmission line and a second transmission line,
a common mode choke having a first coil and a second coil connected to the first transmission line and second transmission line,
two first capacitors connected in series between the first transmission line and the second transmission line, wherein the common mode choke is closer to the physical side while the two first capacitors are closer to the cable side,
a middle line connected between the first two capacitors with an extension line having a distal end connected to a ground node,
two second capacitors connected with the first transmission line and the second transmission line, and
a resistor positioned in the extension line, wherein the two second capacitors are located between the common mode choke and the two first capacitors.

10. A network filtering circuit comprising:
a cable side for connection to a network cable;
a physical side for connection to a mother board; and
a plurality of transmission channels connected between the cable side and the physical side, each transmission channel comprising:
a first transmission line and a second transmission line,
a common mode choke having a first coil and a second coil connected to the first transmission line and second transmission line,
two first capacitors connected in series between the first transmission line and the second transmission line, wherein the common mode choke is closer to the physical side while the two first capacitors are closer to the cable side,
a middle line connected between the two first capacitors with an extension line having a distal end connected to a ground node, and
two second capacitors connected with the first transmission line and the second transmission line; wherein
in each transmission channel said two second capacitors are located between the common mode choke and the two first capacitors, and
two additional capacitors are connected to the first transmission line and the second transmission line in each transmission channel, wherein each additional capacitor is further connected to another ground node.

11. The network filtering circuit as claimed in claim 10, wherein in each of the first transmission line and the second transmission line in each transmission channel, the additional capacitor and the corresponding first capacitor are connected to two opposite ends of the second capacitor.

12. The network filtering circuit as claimed in claim 10, wherein in each transmission channel said two additional capacitors are located between the two second capacitors and the common mode choke.

13. The network filtering circuit as claimed in claim 10, wherein a resistor is positioned in the extension line.

14. The network filtering circuit as claimed in claim 13, further including a third capacitor connected between the ground node and the resistor in the extension line of each transmission channel.

15. The network filtering circuit as claimed in claim 14, wherein all of the plurality of transmission channels share the same third capacitor and the same ground node.

* * * * *